United States Patent [19]

Hirai

[11] Patent Number: 5,192,639
[45] Date of Patent: Mar. 9, 1993

[54] LIGHT-SENSITIVE MATERIAL CONTAINING SILVER HALIDE, REDUCING AGENT, POLYMERIZABLE COMPOUND AND CHROMIUM MOLYBDENUM OR TUNGSTEN COMPOUND

[75] Inventor: Hiroyuki Hirai, Kanagawa, Japan

[73] Assignee: Fuji Photo Film Co., Ltd., Kanagawa, Japan

[21] Appl. No.: 774,483

[22] Filed: Oct. 10, 1991

[30] Foreign Application Priority Data

Oct. 11, 1990 [JP] Japan .................................. 2-272878

[51] Int. Cl.$^5$ .......................... G03C 1/72; G03C 1/725
[52] U.S. Cl. ..................................... 430/138; 430/203; 430/254; 430/281; 430/617; 430/619; 430/955; 430/353
[58] Field of Search ............... 430/138, 203, 253, 254, 430/281, 286, 353, 350, 617, 551, 218, 289, 619, 604, 608, 955

[56] References Cited

U.S. PATENT DOCUMENTS

| | | | |
|---|---|---|---|
| 4,560,637 | 12/1985 | Maeda et al. | 430/202 |
| 4,668,612 | 5/1987 | Hirai | 430/523 |
| 4,806,462 | 2/1989 | Yamashita et al. | 430/604 |
| 4,879,200 | 11/1989 | Oka | 430/138 |
| 4,939,064 | 7/1990 | Nakamura | 430/138 |
| 4,956,260 | 9/1990 | Nakamura | 430/138 |
| 5,030,542 | 7/1991 | Nakamura et al. | 430/138 |
| 5,035,975 | 7/1991 | Takahashi et al. | 430/138 |

Primary Examiner—Marion E. McCamish
Assistant Examiner—Janis L. Dote
Attorney, Agent, or Firm—Sughrue, Mion, Zinn, Macpeak & Seas

[57] ABSTRACT

A light-sensitive material comprises a support and a light-sensitive layer provided thereon. The light-sensitive layer contains silver halide, a reducing agent and an ethylenically unsaturated polymerizable compound. According to the present invention, the light-sensitive layer further contains a chromium (VI) compound, a molybdenum (VI) compound or a tungsten (VI) compound.

15 Claims, No Drawings

LIGHT-SENSITIVE MATERIAL CONTAINING SILVER HALIDE, REDUCING AGENT, POLYMERIZABLE COMPOUND AND CHROMIUM MOLYBDENUM OR TUNGSTEN COMPOUND

FIELD OF THE INVENTION

The present invention relates to a light-sensitive material comprising a support and a light-sensitive layer provided thereon which contains silver halide, a reducing agent and a polymerizable compound.

BACKGROUND OF THE INVENTION

U.S. Pat. No. 4,912,011 discloses a light-sensitive material comprising a support and a light-sensitive layer provided thereon which contains silver halide, a reducing agent, a color image forming substance and a polymerizable compound. The silver halide, the reducing agent, the polymerizable compound and the color image forming substance are contained in microcapsules (light-sensitive microcapsules) which are dispersed in the light-sensitive layer. The U.S. patent corresponds to European Patent Provisional Publication No. 0203613A and Japanese Patent Provisional Publications No. 61(1986) 275742 and No. 61(1986)-278849.

An image forming method using the light-sensitive material is also disclosed in U.S. Pat. No. 4,912,011. The method comprises the steps of imagewise exposing to light the light-sensitive material, and heating the light-sensitive material. A latent image of the silver halide is formed by the exposure. The polymerizable compound is polymerized by heating within the area where the latent image has been formed. The light-sensitive material is then pressed on an image-receiving material to transfer the unpolymerized polymerizable compound with a color image forming substance to the image-receiving material to form a color image on the image-receiving material.

Further, a method of polymerizing the polymerizable compound within the area where the latent image of the silver halide has not been formed is disclosed in Japanese Patent Provisional Publications No. 61(1986)-243449, No. 61(1986)-260241, No. 2(1990)-141756 and No. 2(1990)-141757. The contents of the former two publications are described in European Patent Provisional Publication No 0202490A.

With respect to the heat development process, it is preferred that the development time is as short as possible and the heating temperature is as low as possible. In this regard, various heat development accelerators have been proposed. For example, U.S. Pat. No. 4,956,260 discloses numerous accelerators. These known accelerators are organic compounds.

By the way, an image recording apparatus for the above-described image forming method has been proposed (cf., U.S. Pat. Nos. 4,737,822, No. 4,783,683, No. 4,797,710, No. 4,819,032 and No. 4,825,041). In order to construct a compact image recording apparatus, a short development time and a low heating temperature are required. Even if the above-mentioned accelerators are used, the known light-sensitive materials have not yet satisfyed the requirements.

SUMMARY OF THE INVENTION

An object of the present invention is to provide a light-sensitive material which quickly forms a clear image even if the heating temperature is low.

There is provided by the present invention a light-sensitive material comprising a support and a light-sensitive layer provided thereon, which contains silver halide, a reducing agent and an ethylenically unsaturated polymerizable compound, wherein the light-sensitive layer further contains a chromium (VI) compound, a molybdenum (VI) compound or a tungsten (VI) compound.

The applicant surprisingly finds that a chromium (VI) compound, a molybdenum (VI) compound or a tungsten (VI) compound unexpectedly functions as a heat development accelerator. The accelerating function of the compound is excellent though the accelerating mechanism has not yet been analyzed.

Accordingly, the light-sensitive material of the present invention containing the chromium, molybdenum or tungsten compound quickly forms a clear image even if the heating temperature is low.

DETAILED DESCRIPTION OF THE INVENTION

The light-sensitive material of the present invention is characterized in the chromium (VI), molybdenum (VI) or tungsten (VI) compound.

The chromium, molybdenum or tungsten compound is preferably in the form of a salt of oxide (VI). In the present invention, the salt of oxide includes salts of a polyacid and a heteropolyacid. The counter ion of oxide in the salt preferably is an alkali metal, an alkaline earth metal or ammonium.

The chromium, molybdenum or tungsten compound preferably is a molybdenum (VI) compound It is also preferred that the compound is water-soluble, since the function of the water-soluble compound is stronger than that of the water insoluble compound.

Examples of the chromium (VI) compound include $(NH_4)_2CrO_4$, $K_2CrO_4$, $Na_2CrO_4.4H_2O$, $Cs_2CrO_4$, $BaCrO_4$, $MgCrO_4.5H_2O$, $K_2Mg(CrO_4)_2.2H_2O$ and $(NH_4)_2Mg(CrO_4)_2.6H_2O$.

Examples of the molybdenum (VI) compound include $MoO_3.H_2O$, $(NH_4)_6Mo_7O_{24}.4H_2O$, $K_2MoO_4$, $Na_2MoO_4.2H_2O$, $CaMoO_4$, $(NH_4)_3[PMo_{12}O_{40}].3H_2O$, $Na_3[PMo_{12}O_{40}].10H_2O$ and $Li_2MoO_4$.

Examples of the tungsten (VI) compound include $WO_3.H_2O$, $K_2WO_4$, $Na_2WO_4.2H_2O$, $CaWO_4$, $MgWO_4$, $Na_3[PW_{12}O_{40}].15H_2O$ and $(NH_4)_{10}W_{12}O_{41}.5H_2O$.

Two or more chromium, molybdenum or tungsten compounds may be used in combination.

The amount of the chromium, molybdenum and tungsten atoms contained in the light-sensitive layer is preferably in the range of 0.1 mg/m$^2$ to 2,000 mg/m$^2$ and more preferably in the range of 1 mg/m$^2$ to 500 mg/m$^2$. In the case that microcapsules are contained in the light-sensitive layer, the chromium, molybdenum or tungsten compound may be contained in the microcapsules or arranged outside of the microcapsules.

In preparation of the light-sensitive material, the chromium, molybdenum or tungsten compound is preferably used in the form of an aqueous solution (where the compound is water-soluble) or an aqueous dispersion (where the compound is water-insoluble) to add the compound to the other components of the light-sensitive layer. The aqueous solution or dispersion is preferably neutralized by using an acid such as sulfuric acid or phosphoric acid to improve the stability of the light-sensitive material.

The silver halide, the reducing agent, the polymerizable compound and the support used in the light-sensitive material of the present invention are described below.

Examples of the silver halide used in the light-sensitive material include silver chloride, silver bromide, silver iodide, silver chlorobromide, silver chloroiodide, silver iodobromide and silver chloroiodobromide in the form of grains.

The silver halide grains may be of various crystal forms, for example, a regular crystal form such as hexahedron, octahedron or tetradecahedron, an irregular form such as spherical form or tubular form, a form having crystalline defect such as a twinning plane, and a mixed form thereof.

The silver halide grains may be extremely small sized grains having a grain diameter of not more than about 0.01 μm, or may be relatively large sized grains having a grain diameter of projected area up to about 10 μm. The silver halide emulsion may be a polydispersed emulsion or a monodispersed emulsion described in U.S. Pat. Nos. 3,574,628 and No. 3,655,394, and U.K. Patent No. 1,413,748.

A tubular grain having an aspect ratio of not less than approx. 5 can be also employed. The tabular silver halide grains can be easily prepared by processes described in Gutoff, "Photographic Science and Engineering, Vol. 14, pp. 248-257 (1970)", U.S. Pat. Nos. 4,434,226, No. 4,414,310, No. 4,433,048 and No. 4,439,520, and U.K. Patent No. 2,112,157.

As for the crystal structure of the silver halide grains, the individual grains may have a homogeneous halogen composition or a heterogeneous halogen composition in which the composition varies from the outer surface portion to the inside portion, or may be a multi-layer structure. Otherwise, the silver halide grains may be bonded with other silver halide grains having different halogen composition through epitaxial bonding, or may be bonded with compounds other than the silver halide such as silver rhodanate and lead oxide. Two or more kinds of silver halide grains which differ in halogen composition, crystal habit, grain size, and/or other features from each other can be employed in combination.

The silver halide photographic emulsions employable in the light-sensitive material of the invention can be prepared by processes described, for example, in "Research Disclosure (RD), No. 17,643, pp. 22-23 (Dec. 1978), (Emulsion preparation and types) and No. 18,716, p. 648.

The silver halide emulsion is generally used after subjecting it to physical ripening, chemical ripening and spectral sensitization. Various additives employable in those stages are described in Research Disclosure, No. 17,643 and No. 18,716. The relevant parts in the literature are described below in the form of a table.

Conventional photographic additives employable in the invention are also described in the above-mentioned Research Disclosure, and the relevant parts in the literature are also shown in the following table.

| Additives | RD 17,643 | RD 18,716 |
|---|---|---|
| Chemical sensitizing agent | p. 23 | p. 648 (right side) |
| Sensitivity-increasing agent | | p. 648 (right side) |
| Spectral sensitizing agent and Supersensitizing agent | p. 23-24 | p. 648 (right side)-p. 649 (right side) |
| Anti-fogging agent and Stabilizer | p. 24-25 | p. 649 (right side) |

It is preferred to use silver halide grains having a relatively low fogging value.

For uniformly incorporating the silver halide into microcapsules, a copolymer composed of a hydrophilic repeating unit and a hydrophobic repeating unit is preferably dissolved in the polymerizable compound.

The reducing agent used in the light-sensitive material of the invention has a function of reducing the silver halide and/or a function of accelerating (or restraining) polymerization of the polymerizable compound. There are known various reducing agents having the above-mentioned functions. Examples of such reducing agents include hydroquinones, catechols, p-aminophenols, p-phenylenediamines, 3-pyrazolidones, 3-aminopyrazoles, 4-amino-5-pyrazolones, 5-aminouracils, 4,5-dihydroxy-6-aminopyrimidines, reductones, aminoreductones, o- or p-sulfonamidophenols, o- or p-sulfonamidonaphthols, 2,4-disulfonamidephenols, 2,4-disulfonamidenaphthols, o- or p-acylaminophenols, 2-sulfonamidoindanones, 4-sulfonamido-5-pyrazolones, 3-sulfonamidoindoles, sulfonamidopyrazolobenzimidazoles, sulfonamidopyrazolotriazoles, α-sulfonamidoketones and hydrazines.

By adjusting the kind, amount of the above reducing agent, the polymerizable compound can be polymerized within the area where a latent image of the silver halide has been formed or has not been formed. In a system wherein the polymerizable compound is polymerized within the area where a latent image of the silver halide has not been formed, 1-phenyl-3-pyrazolidones, hydroquinones and sufonamidephenols are particularly preferred as the reducing agent.

Various reducing agents having the above-mentioned functions (including compounds referred to as developing agent, hydrazine derivative) are described in T. James, "The Theory of the Photographic Process", 4th edition, pp. 291-334 (1977), Research Disclosure Vol. 170, No. 17029, pp. 9-15 (June 1978), and Research Disclosure Vol. 176, No. 17643, pp. 22-31 (December 1978). Further, there can be also employed a reducing agent precursor capable of releasing a reducing agent under heating or in contact with a base. Also in the light-sensitive material of the invention, various reducing agents and reducing agent precursors can be effectively employed. Thus, "the reducing agent(s)" in the present specification means to include all of the reducing agents and reducing agent precursors described in the publications.

Among the above-mentioned reducing agents, those having a basic nature, which form an acid and a salt, can be used in the form of a salt of an appropriate acid.

The reducing agents can be used singly or in combination. In the case that two or more reducing agents are used in combination, certain interactions between the reducing agents may be expected. One of the interactions is for acceleration of reduction of silver halide (and/or an organic silver salt) through so-called super-additivity. Other interaction is for a chain reaction in which an oxidized state of one reducing agent formed by a reduction of silver halide (and/or an organic silver salt) induces or inhibits the polymerization of the polymerizable compound via oxidation-reduction reaction with other reducing agent. Both interactions may occur simultaneously. Thus, it is difficult to determine which of the interactions has occurred in practical use.

Concrete examples of the above-mentioned reducing agents are as follows.

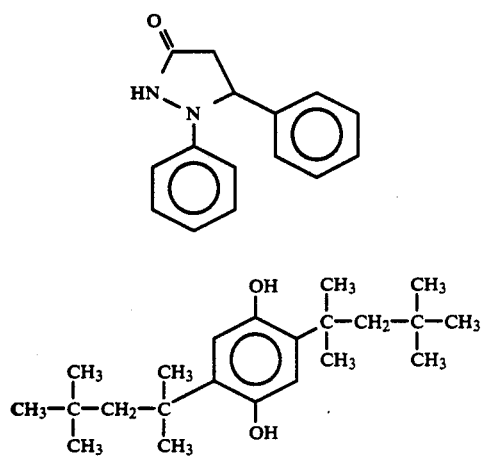
(1)

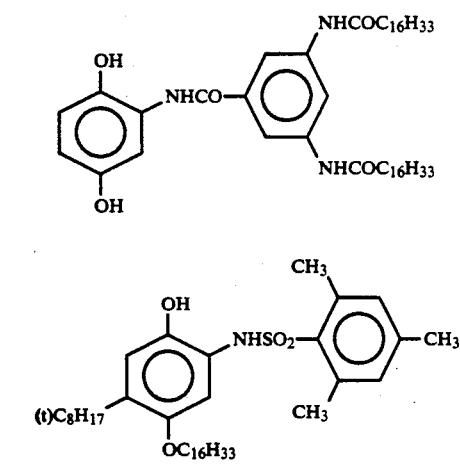
(2)

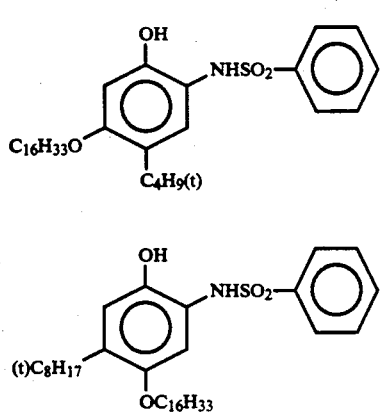
(3)

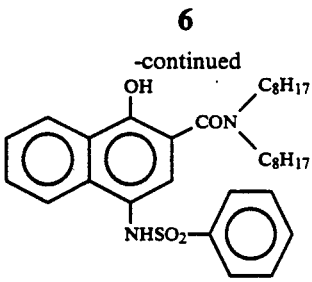
(4)

(5)

(6)

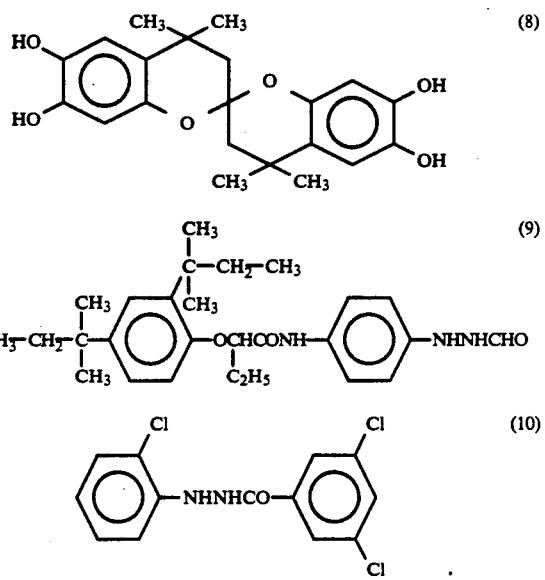
(7)

(8)

(9)

(10)

(11)

(12)

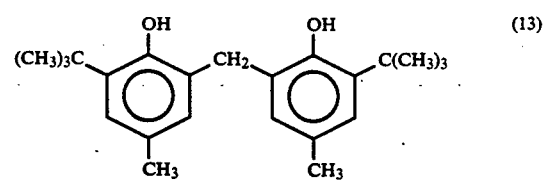
(13)

The reducing agent can be used in the light-sensitive material in an amount of wide range, but generally the amount thereof is in the range of 0.1 to 1,500 mole %, preferably in the range of 1 to 300 mole %, based on the amount of the silver salt.

The polymerizable compound used in the light-sensitive material is a compound having an ethylenically unsaturated group.

Examples of the compounds having an ethylenic unsaturated group include acrylic acids, salts of acrylic acids, acrylic esters, acrylamides, methacrylic acid, salts of methacrylic acids, methacrylic esters, methacrylamides, maleic anhydride, maleic esters, itaconic esters, styrenes, vinyl ethers, vinyl esters, N-vinyl heterocyclic compounds, allyl ethers, allyl esters, and derivatives thereof.

Examples of the acrylic esters include n-butyl acrylate, cyclohexyl acrylate, 2-ethylhexyl acrylate, benzyl acrylate, furfuryl acrylate, ethoxyethoxyethyl acrylate, tricyclodecanyl acrylate, nonylphenyloxyethyl acrylate, 1,3-dioxolan acrylate, hexanediol diacrylate, butanediol diacrylate, neopentylglycol diacrylate, tricyclodecandimethylol diacrylate, trimethylolpropane triacrylate, pentaerythritol tetraacrylate, dipentaerythritol pentaacrylate, dipentaerythritol hexacrylate, diacrylate of polyoxyethylenated bisphenol A, 2-(2-hydroxy-1,1-dimethylethyl)-5-hydroxymethyl-5-ethyl-1,3-dioxane diacrylate, 2-(2-hydroxy-1,1-dimethylethyl)-5,5-dihydroxymethyl-1,3-dioxane triacrylate, triacrylate of propyleneoxide addition product of trimethylolpropane, polyacrylate of hydroxypolyether, polyester acrylate and polyurethane acrylate.

Examples of the methacrylic esters include methyl methacrylate, butyl methacrylate, ethylene glycol dimethacrylate, butanediol dimethacrylate, neopentylglycol dimethacrylate, trimethylolpropane trimethacrylate, pentaerythritol trimethacrylate, pentaerythritol tetramethacrylate and dimethacrylate of polyoxyalkylenated bisphenol A.

The polymerizable compounds can be used singly or in combination of two or more compounds. Further, polymerizable compounds in which a polymerizable functional group such as a vinyl group or a vinylidene group is introduced into a chemical structure of the above-described reducing agent can be also employed as the polymerizable compound.

There is no specific limitation with respect to the support used in the invention, but it is preferred to use materials which are resistant to temperatures given in the developing stage as the support material.

Examples of the materials used for the preparation of the support include glasses, ordinary papers, fine paper, coat paper, cast-coat paper, synthetic papers, metals and analogues thereof, various films made of polyester, polyethylene, polypropylene, acetyl cellulose, cellulose ester, polyvinyl acetal, polystyrene, polycarbonate, polyethylene terephthalate and polyimide, and papers laminated with resin or polymer (e.g., polyethylene).

Optionally employable components contained in a light-sensitive layer and optional layers included in a light-sensitive material are described below.

A color image forming substance can be contained in the light-sensitive layer to form a color image. There is no specific limitation with respect to the color image forming substance, and various kinds of substances are available. Examples of the color image forming substance include colored substance (i.e., dyes and pigments) and non-colored or almost non-colored substance (i.e., color former or dye- or pigment-precursor) which develops to give a color by an external energy (e.g., heating, pressing or light irradiation) or by other components (i.e., color developer).

In the present invention, the color image forming substance preferably is a colored substance such as a dye or a pigment. A pigment is particularly preferred.

As the pigment used in the invention, there can be mentioned not only those commercially available but also those described in various literatures such as "Handbook of Color Index (C. I.)", Nippon Ganryo Gijutsu Kyokai (ed.), "New Handbook of Pigments (1977)", CMC Shuppan (ed.), "New Application and Technique of Dyes (1986)", and CMC Shuppan (ed.), "Printing Ink Technique (1984)".

The pigments can be classified based on the color difference into white pigment, black pigment, yellow pigment, orange pigment, brown pigment, red pigment, violet pigment, blue pigment, green pigment, fluorescent pigment, metallic powder pigment, and polymeric linking dyestuff. Examples of a pigment include insoluble azo pigment, azolake pigment, condensed azo pigment, chelate azo pigment, phthalocyanine pigment, anthraquimone pigment, pelylene and perynone pigment, thioindigo pigment, quinacridone pigment, dioxadine pigment, isoindolinone pigment, quinophthalone pigment, color lake pigment, azine pigment, nitroso pigment, nitro pigment, natural pigment, fluorescent pigment and inorganic pigment.

The pigment particles are preferably surface treated to be lipophilic. The methods of surface treatment include a method having the step of coating with a resin or a wax, a method having the step of attaching of a surface active agent or a method having the step of connecting an active substance (e.g., a silane coupling agent, an epoxy compound and polyisocyanate) onto the surface of the pigment. The methods are disclosed in "Nature and Application of Metallic Soap", Saiwai Shobo (ed.); "Printing Ink Technique", CMC Shuppan (ed. 1984); and "New Application and Technique of Pigment", CMC Shuppan (ed. 1986).

The diameter of the pigment particles preferably is in the range of 0.01 to 10 $\mu$m, more preferably 0.05 to 1 $\mu$m in the measurement after the particles are dispersed in the polymerizable compound.

The color image forming substance such as the pigment and the dye is preferably used in an amount of 5 to 60 parts by weight, based on 100 parts by weight of the polymerizable compound. The pigment particles can be dispersed in the same manner as in a known dispersing technique such as preparation of ink or toner. Various dispersing devices are available. Examples of the dispersing device include a sand mill, an attritor, a pearl mill, a supermill, a ball mill, an impeller, a disperser, a KD mill, a colloid mill, a dynatron, a three-rolls mill and a pressure kneader. The dispersing devices are described in "New Application and Technique of Pigment", CMC Shuppan (ed. 1986).

Examples of the dye used in the present invention include azo dyes such as; benzene-azo, naphthalene-azo and heterocyclic azo; stilbene dyes; nitro and nitroso dyes; carbonium dyes such as diphenylmethane, triphenylmethane, xanthene and acridine; quinoline dyes; methine dyes such as polymethine and azomethine; thiazole dyes; quinone imine dyes such as azine, oxazine and thiazine; lactone dyes; aminoketone and hydroxyketone dyes; anthraquinone dyes; benzquinone and naphthoquinone dyes; indigoid dyes such as indigo and thioindigo; phthalocyanine dyes; naphthalimide dyes; perinone dyes; and metallic chelate. These dyes are described in Yuki Gosei Kagaku Kyokai (ed.), Handbook of Dyes (written in Japanese, 1970), and Teiji Abeta and Kunihiko Imada, Description of Dye Chemistry (written in Japanese). Azo dyes, azomethine dyes, anthraquinone dyes and phthalocyanine dyes are preferred, since the hue and the stability of these dyes are appropriate for the present invention.

A base or base precursor is preferably contained in the light-sensitive layer. The base precursor is preferred to the base, since a light-sensitive material containing the base tends to be degraded.

The base precursor used in the present invention includes various inorganic or organic compounds, and is classified into decarboxylation type, thermal decomposition type, reaction type and complex salt-formation type.

The base precursor preferably is a salt of an organic base and an acid which decarboxylates under heating or a compound which release a base under heating.

The base precursor used in the invention preferably releases a base at a temperature in the range of 50° C. to 200° C., and more preferably 80° C. to 180° C.

The base precursor preferably has a solubility in water of not more than 1% at 25° C. to be incorporated into microcapsules.

A preferred base precursor is composed of a salt of an organic base with a carboxylic acid. The organic base preferably is a diacidic, triacidic or tetraacidic base which composed of two to four amidine or guanidine moieties and at least one residue of a hydrocarbon or a heterocyclic ring as a linking group of the amidine or guanidine moieties.

The amidine moiety corresponds to an atomic group formed by removing one or two hydrogen atoms from the compound having the formula (I).

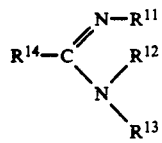
(I)

In the formula (I), each of $R^{11}$, $R^{12}$, $R^{13}$ and $R^{14}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{11}$, $R^{12}$, $R^{13}$ and $R^{14}$ may be combined together to form a five-membered or six-membered nitrogen-containing heterocyclic ring.

The guanidine moiety corresponds to an atomic group formed by removing one or two hydrogen atoms from the compound having the formula (II).

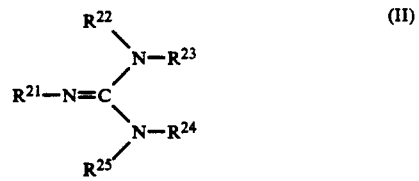
(II)

In the formula (II), each of $R^{21}$, $R^{22}$, $R^{23}$, $R^{24}$ and $R^{25}$ independently is a monovalent group selected from the group consisting of hydrogen, an alkyl group, an alkenyl group, an alkynyl group, a cycloalkyl group, an aralkyl group, an aryl group and a heterocyclic group, each of which may have one or more substituent group; and any two of $R^{21}$, $R^{22}$, $R^{23}$, $R^{24}$ and $R^{25}$ may be combined together to form a five-membered or six-membered nitrogen-containing heterocyclic ring.

Examples of the base precursor are shown below.

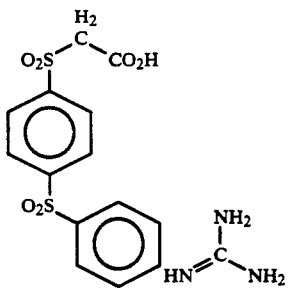
(1)

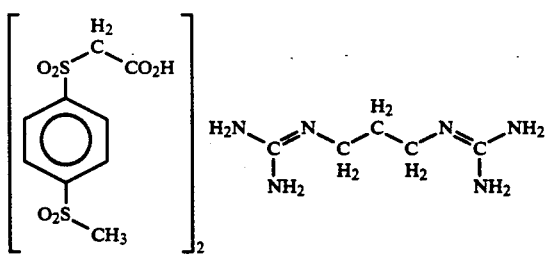
(2)

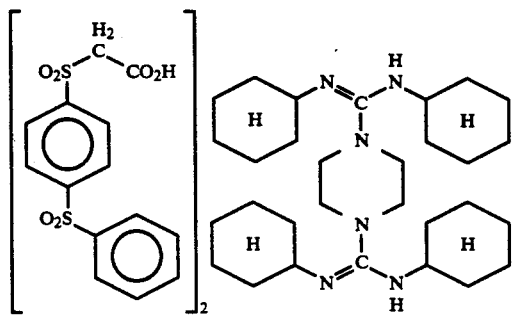
(3)

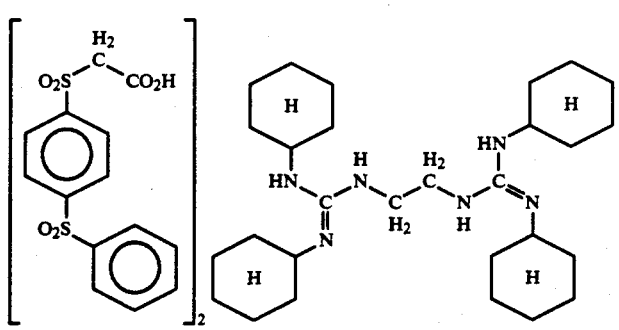
(4)
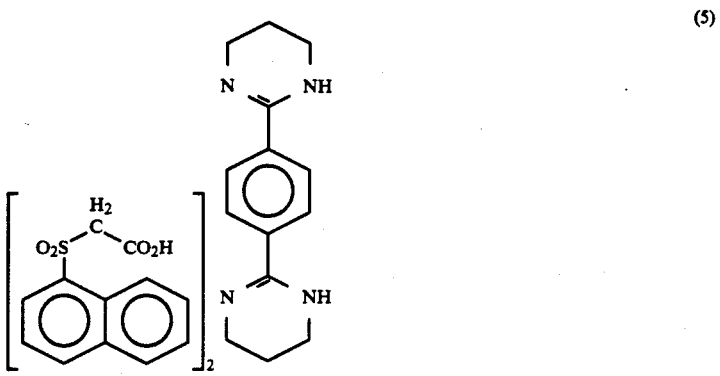
(5)
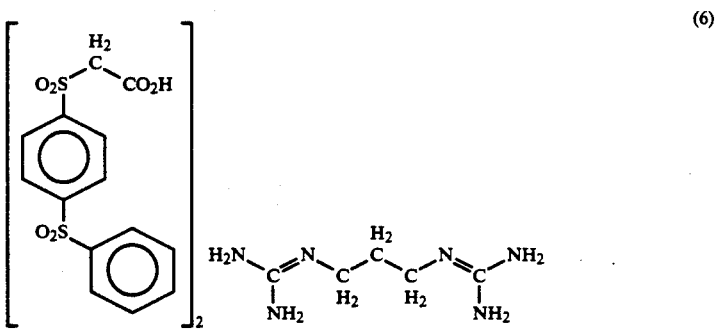
(6)
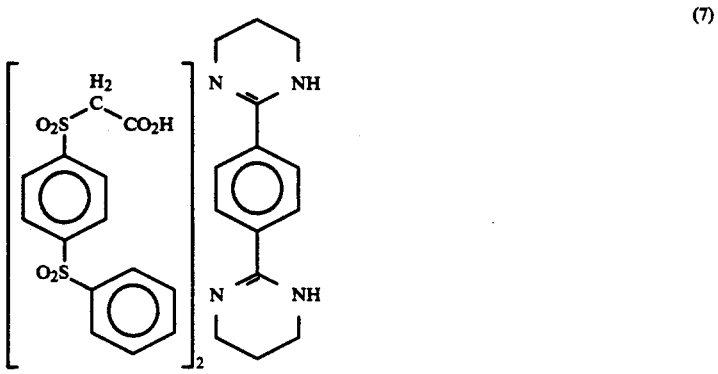
(7)

(8)
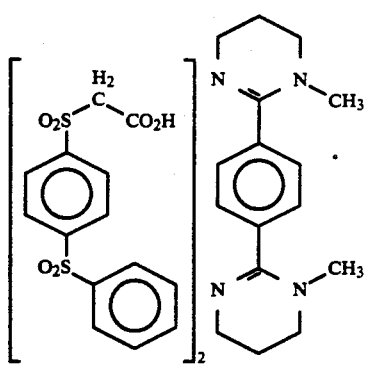
(9)
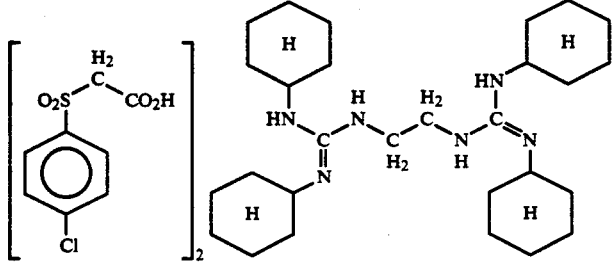
(10)
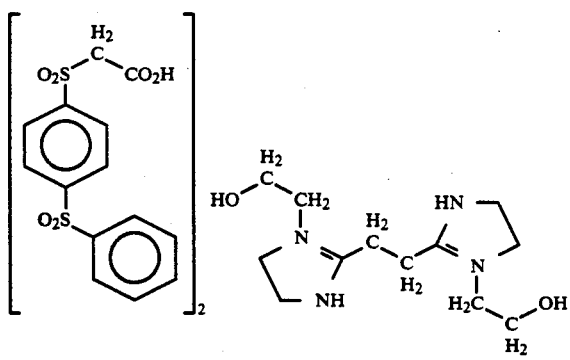
(11)
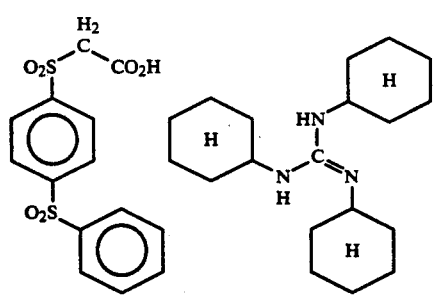
(12)
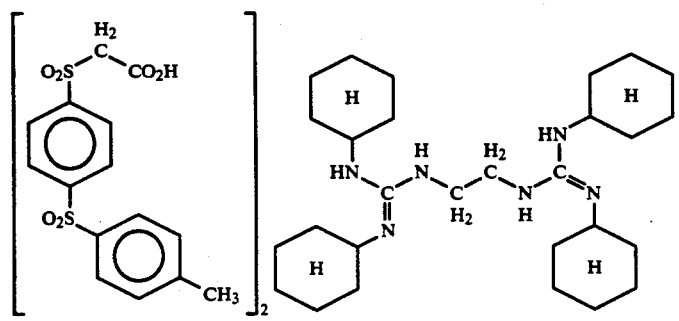

The components of the light-sensitive layer are preferably contained in microcapsules. There is no specific limitation on the preparation of microcapsules, and any known processes can be employed. Examples of the processes for preparing microcapsules include a process utilizing coacervation of hydrophilic wall-forming materials (U.S. Pat. Nos. 2,800,457 and No. 2,800,458); an interfacial polymerization process (U.S. Pat. No. 3,287,154, U.K. Patent No. 990,443, and Japanese Patent Publications No. 38(1963)-19574, No. 42(1967)-446 and No. 42(1967)-771); a process utilizing precipitation of polymers (U.S. Pat. Nos. 3,418,250 and No. 3,660,304); a process of using isocyanate-polyol wall-materials (U.S. Pat. No. 3,796,669); a process of using isocyanate wall-materials (U.S. Pat. No. 3,914,511); and a process of using amino-aldehyde resins (U.S. Pat. Nos. 4,001,140, No. 4,087,376, No. 4,089,802 and No. 4,025,455, and Japanese Patent Provisional Publications No. 62(1987)-209439, No. 64(1989)-91131 and No. 1(1989)-154140).

Examples of the amino-aldehyde resins include an urea-formaldehyde resin, an urea-formaldehyde resorcinol resin, a melamine-formaldehyde resin, an acetoguanamine-formaldehyde resin and a benzoguanamine-formaldehyde resin.

Further, examples of the processes for preparing microcapsules include an in situ process utilizing polymerization of monomers (Japanese Patent Publication No. 36(1961)-9168 and Japanese Patent Provisional Publication No. 51(1976)-9079); a polymerization dispersing and cooling process (U.K. Patents No. 927,807 and No. 965,074); and a spray-drying process (U.S. Pat. No. 3,111,407 and U.K. Patent No. 930,422).

A process for encapsulating oily droplets of the polymerizable compound is not limited to the above-mentioned ones, but a process of emulsifying core materials and then forming a polymeric membrane as a microcapsule shell over the core material is particularly preferred. Examples of the shell material include a polyamide resin and/or a polyester resin, a polyurea resin and/or a polyurethane resin, gelatin, an epoxy resin, a complex resin containing a polyamide resin and a polyurea resin, a complex resin containing a polyurethane resin and a polyester resin. A melamine-formaldehyde resin, of which fine microcapsules can be made, is particularly preferred in the invention.

The microcapsule having a polymer shell of a polymeric compound around a film composed of a reaction product of a water-soluble polymer having a sulfinyl group and a polymerizable compound having an ethylenic unsaturated group is preferred.

In the case that aminoaldehyde resins are used for microcapsules, the amount of residual aldehyde is preferably regulated to be below a certain value.

A mean grain size of microcapsules is preferably within the range of 3 to 20 $\mu$m. It is preferred that the grain sizes of microcapsules be homogeneously dispersed in the range above a certain value. The ratio between the thickness and the grain size of a microcapsule is preferably within a certain range.

In the case that a silver halide is contained in microcapsules, the above-described mean grain size of the silver halide is preferably not more than one fifth of the mean grain size of microcapsules, and more preferably it is not more than one tenth. A homogeneous and smooth image can be obtained by regulating the mean grain size of the silver halide not to be more than one fifth of the mean grain size of microcapsules.

In the case that a silver halide is contained in microcapsules, the silver halide is preferably contained within the shell of the microcapsule.

In preparation of the microcapsules, a base precursor can be directly dispersed in a polymerizable compound. However, it is particularly preferred that a base precursor is dispersed in water, and the dispersion is then emulsified in a polymerizable compound. In this case, a nonionic or amphoteric water soluble polymer is preferably dissolved in water in which the base precursor is dispersed.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. An example of the amphoteric water soluble polymer is gelatin.

The water soluble polymer is preferably used in an amount of 0.1 to 100 weight % based on the amount of the base precursor, and more preferably 1 to 50 weight %. The base precursor is preferably contained in the dispersion in an amount of 5 to 60 weight %, and more preferably of 10 to 50 weight %. The base precursor is preferably used in an amount of 2 to 50 weight % based on the amount of the polymerizable compound, and more preferably 5 to 30 weight %.

When a shell of a microcapsule is formed by dispersing an oily liquid containing a base precursor to an aqueous medium in the process for preparing the light-sensitive microcapsules, a nonionic or anionic water soluble polymer is preferably contained in the aqueous medium. The amount of oily liquid is preferably within the range of 10 to 120 weight. %, more preferably 20 to 90 weight. %, based on the amount of the aqueous medium.

Examples of the nonionic water soluble polymer include polyvinyl alcohol, polyvinyl pyrrolidone, polyacrylamide, polymethylvinyl ether, polyacryloylmorpholine, polyhydroxyethylacrylate, polyhydroxyethylmethacrylate-co-acrylamide, hydroxyethyl cellulose, hydroxypropyl cellulose and methylcellulose. Examples of the anionic water soluble polymer include polystyrenesulfinic acid, a salt of a copolymer of styrenesulfinic acid, a salt of polystyrenesulfonic acid, a copolymer of styrenesulfonic acid, a salt of polyvinyl sulfate, a salt of polyvinylsulfonic acid, a copolymer of maleic anhydride and styrene, and a copolymer of maleic anhydride and isobutylene.

The aqueous medium preferably contains the anionic water soluble polymer in an amount of 0.01 to 5 weight %, and more preferably 0.1 to 2 weight %. It is particularly preferred to use a water soluble polymer having a few sulfinic groups together with a nonionic water soluble polymer.

A hydrophilic compound is preferably dissolved in a polymerizable compound to reduce the solubility of the base precursor in the polymerizable compound. Examples of the hydrophilic group of the compound include —OH, —SO$_2$NH$_2$, —CONH$_2$ and —NHCONH$_2$. Examples of the hydrophilic compound include polyethylene glycol, polypropylene glycol, benzoic amide, cyclohexylurea, octyl alcohol, dodecyl alcohol, stearyl alcohol and stearamide.

The binder employable for the light-sensitive material can be included in the light-sensitive layer singly or in combination. A water-soluble binder is preferably employed. A typical water-soluble binder is transparent or semi-transparent one, of which examples include natural substances such as gelatin, gelatine derivatives, cellulose derivatives, starch and gum arabic; and synthetic polymer substances such as polyvinyl alcohol, polyvinyl pyrrolidone and water-soluble polyvinyl compound (e.g., acrylamide polymer). One of the other examples of synthetic polymer substances is a dispersing vinyl compound which increases the size-stability of photographic materials in form of latex.

An organometalic salt can be used as an oxidizing agent in combination with silver halide in the invention. An organic silver salt is most preferably employed.

Examples of an organic compound employable for forming such organosilver salt oxidizing agent include benzotriazoles, aliphatic acids and other compounds described in U.S. Pat. No. 4,500,626 (columns 52–53). Also effectively employable are silver salts of carboxylic acids having alkynyl group (e.g., silver phenylpropionate) and acetylene silver salt. The organic silver salts can be used singly or in combination of two or more kinds.

The above-mentioned organic silver salt can be used in combination with a light-sensitive silver halide in an amount of 0.01 to 10 mole, preferably 0.01 to 1 mole, per 1 mole of the silver halide. The total amount of the organic silver salt and the silver halide is generally within a range of 1 mg/m$^2$ to 10 g/m$^2$ in terms of the amount of silver metal.

The antismudging agent employable for the light-sensitive material is preferably used in form of solid grains at room temperature. Concrete examples of the antismudging agent employable for the light-sensitive material include starch grains described in U.K. Patent No. 1,232,347, fine powder of polymer U.S. Pat. No. 3,625,736, microcapsules containing no color developing agent described in U.K. Patent No. 1,235,991, fine powder of cellulose described in U.S. Pat. No. 2,711,357 and inorganic grains such as talc, kaolin, bentonite, pagodite, zinc oxide, titanium oxide, alumina. A mean grain size of the above-mentioned grains is preferably within the range of 3 to 50 μm, more preferably 5 to 40 μm, in terms of volume mean diameter. It is effective that the size of the grain is larger than that of the microcapsule.

Various image formation accelerators is employable for the light-sensitive material.

Image formation accelerators have the functions such as 1) accelerating the transfer of a base or a base precursor, 2) accelerating the reaction of a reducing agent and a silver salt, 3) accelerating the polymerization reaction of fixing a color image forming substance. From a viewpoint of physical chemistry concerning the functions, the image formation accelerators can be classified into base or base precursor nucleophilic compounds, oils, heat solvents, surface active agents, compounds having interactions with silver or silver salts, compounds having deoxidization function and other compounds. However, these substances generally have complex functions, so each of them usually has some acceleration effects described above.

In the system wherein the polymerizable compound is polymerized within the area where a latent image of silver halide is not formed, a thermal polymerization initiator or a photopolymerization initiator may be contained in the light-sensitive layer. Further, the thermal polymerization initiator or the photopolymerization initiator may also be contained in the image-receiving material to harden the transferred image.

Examples of the thermal polymerization initiator include azo compounds, organic peroxides, inorganic peroxides and sulfinic acids. The thermal polymerization initiator is described in "Addition Polymerization and Ring Opening Polymerization", pp. 6–18, edited by the Editorial Committee of High Polymer Experimental Study of the High Polymer Institute, published by Kyoritsu Shuppan (1983).

Examples of the photopolymerization initiator include benzophenones, acetophenones, benzoins and thioxanthones. The photopolymerization initiator is described in "Ultraviolet Ray Hardening System", pp. 63–147, edited by the General Technical Center (1989).

Various surface active agents are employable for the light-sensitive material for various purpose, such as aiding the coating process, increasing facility of peeling off, increasing slipperiness, preventing electrification and accelerating development.

An antistatic agent is employable for the light-sensitive materials in order to prevent electrifying. Antistatic agents are described in Research Disclosure Vol. 176, No. 17643, pp. 27 (November 1978).

In order to prevent halation and irradiation, a dye or a pigment may be added to the light-sensitive layer of the light-sensitive materials.

The microcapsules may contain a coloring matter having a property of being decolored by heating or irradiation with light. The coloring matter having a property of being decolored by heating or irradiation with light can play the role corresponding to yellow filter in the conventional silver salt photography system.

In the case that a solvent of a polymerizable compound is used for the light-sensitive material, the solvent is preferably contained in microcapsules other than those containing polymerizable compound. Silver halide grains adsorbing water soluble vinyl polymer can be also employed.

Various development terminators can be employable for the light-sensitive materials in order to obtain an image of constant quality independent of the temperature and the process of development treatment.

In the specification, "a development terminator" means a compound which interacts with silver or silver salts to inhibit the development, or a compound which neutralizes or reacts with a base to reduce the base concentration in order to terminate the development. Concrete examples of a development terminator include a acid precursor which emits an acid by heating, an electrophilic compound which substitutes a chlorine atom existing together with by heating, a nitrogen-including heterocyclic compound, a mercapto compound and a precursor thereof.

In the case that gelatin is employed as a binder of the light-sensitive material, various hardening agents are employable. Concrete examples include aldehyde type hardening agents, aziridine type hardening agents, epoxy type hardening agents, vinylsulfonate type hardening agents, N-methylole type hardening agents and polymer type hardening agents.

Other optional components are described in Research Disclosure Vol. 170, No. 17029, pp. 9–15 (June, 1978).

Examples of an optional layer provided in a light-sensitive material include an image-receiving layer, a heating layer, an anti-electrifying layer, an anti-curling layer, a peeling layer, a cover sheet or a protective layer, a layer containing a base or a base precursor, a layer of base barrier and an anti-halation layer (a coloring layer).

When the light-sensitive material is used, the image may be formed on the above-mentioned image-receiving layer provided on the light-sensitive material, instead of using an image-receiving material (described later). An image-receiving layer provided on the light-sensitive material can have the same constitution as that on an image-receiving material. The detail of the image-receiving layer is described below.

The value of pH in the light-sensitive layer of the invention is preferably not more than 7. The value of pH in the light-sensitive layer preferably is not elevated by heating.

Using the light-sensitive material of the invention, an image can be formed on an image-receiving material. The image-receiving material is described below.

As a support of an image-receiving material, not only the above-described support of a light-sensitive material but also baryta paper can be employed. In the case that a porous material such as paper is used as a support of an image-receiving material, the surface of the material preferably has a certain smoothness.

A image-receiving material generally comprises a support and an image-receiving layer provided thereon. The image-receiving layer can be desirably constituted with various compounds, depending upon color developing system of the above-mentioned color image forming substances and other conditions. In the present invention, a dye or pigment is used as an color image forming substances. Therefore, the image-receiving material may comprise a support alone.

The image-receiving layer can comprise at least one layer including a mordanting agent. The mordanting agent can be selected from the compounds known in the field of photographic technology. If necessary, an image-receiving layer may comprise two or more layers using plural mordanting agents of which mordantabilities are different each other.

An image-receiving layer of an image-receiving material comprises a white pigment, a binder and other additives. A white pigment itself or space among the white pigment grains enhances the acceptability of a polymerizable compound.

Examples of the white pigment employable for an image-receiving layer include inorganic white pigments such as oxides (e.g., silicon oxide, titanium oxide, zinc oxide, magnesium oxide and aluminium oxide), salts of alkaline earth metals (magnesium sulfate, barium sulfate, calcium sulfate, magnesium carbonate, barium carbonate, calcium carbonate, calcium silicate, magnesium hydroxide, magnesium phosphate and magnesium hydrogenphosphate), aluminium silicate, aluminum hydroxide, zinc sulfide, various kinds of clay, talc, kaolin, zeolite, acid clay, soluble clay and glass; organic white pigments such as polyethylene, polystyrene, benzoguanamine resin, urea-formalin resin, melamine-formalin resin and polyamide resin. The white pigment above-described can be used in the invention singly or in combination. A white pigment which can absorb a high amount of a polymerizable compound is preferably used.

A mean grain size of the white pigment is within a range of 0.1 to 20 μm, preferably 0.1 to 10 μm. The amount of the pigment is in the range of 0.1 to 60 g, preferably 0.5 to 30 g. The weight ratio of the white pigment to a binder preferably is in the range of 0.01 to 0.4, and more preferably 0.03 to 0.3.

As the binder, a water-soluble polymer, a polymer latex and a polymer soluble in an organic solvent are employed.

Examples of the water-soluble polymer include cellulose derivatives such as carboxymethylcellulose, hydroxyethylcellulose and methylcellulose; proteins such as gelatin, phthalated gelatin, casein and egg albumin; starch and its derivatives such as dextrin and etherificated starch; synthetic polymers such as polyvinyl alcohol, partial acetal of polyvinyl alcohol, poly-N-vinyl pyrolidone, polyacrylic acid, polymethacrylic acid, polyacrylamide, polyvinyl imidazole, polyvinyl pirazole and polystyrenesulfonic acid; and others such as locust bean gum, pullulan, gum arabic and sodium alginate.

Examples of the polymer latex include styrene-butadiene copolymer latex, methyl methacrylate-butadiene copolymer latex, polyacrylate latex, polymethacrylate latex, acylate-methacrylate copolymer latex and ethylene-vinyl acetate copolymer latex.

Examples of the polymer soluble in an organic solvent include polyester resin, polyurethane resin, polyvinyl chloride resin and polyacrylonitrile resin.

The binders can be used singly or in combination. A combination of two or more binders can be employed to cause a phase separation in the image recording layer.

The image-receiving layer may further contain various components other than the white pigment and the binder.

For example, a color developer can be contained in the image-receiving layer in the case that a color formation system using a color former and the color developer is used. Examples of the color developer include phenols, organic acids and salts, and esters. Zinc salt of an salicylic acid derivative is preferred in the case that a leuco dye is used as a color image forming substance (color former). 3,5-di-α-methylbenzylsalicylic acid is particularly preferred.

The color developer is preferably contained in the image-receiving layer in a coating amount of 0.1 to 50 g/m$^2$, and more preferably 0.5 to 20 g/m$^2$.

A thermoplastic compound may be contained in the image recording layer. In the case that the thermoplastic compound is contained in the image recording layer, the image recording layer itself is preferably composed of an agglomerate of fine particles of the thermoplastic compound (i.e., granular thermoplastic compound). The image recording layer having this constitute has such advantages that the formation of a transferred image can be readily done and a glossy image can be obtained under heating after the image formation. There is no specific limitation on the thermoplastic compounds, and any known thermoplastic resins (plastics) and waxes can be employed. The glass transition point of the thermoplastic resin or the melting point of the wax preferably is not higher than 200° C.

A photopolymerization initiator or a thermal polymerization initiator may be contained in the image recording layer. The photopolymerization initiator or the thermal polymerization initiator can be incorporated into the image recording layer to cure the unpolymerized polymerizable compound.

Use of the light-sensitive material is described below.

In the use of the light-sensitive material, the light-sensitive material is subjected to development process simultaneously with or after imagewise exposure.

Various exposure means can be employed in the imagewise exposure, and in general, the light-sensitive material is imagewise exposed to a radiation including visible light to obtain a latent image of the silver halide. The kind of light source or the amount of light employed in the exposure can be selected depending on a light-sensitive wavelength (or intensified wavelength in the case of spectral sensitization) of the silver halide and a sensitivity of the light-sensitive material. An original image can be either monochromatic image or color image.

Development of the light-sensitive material can be conducted simultaneously with or after the imagewise exposure.

The light-sensitive material may be subject to a development treatment using a developing solution. However, a heat development process is a dry treatment, so it is simple and needs short time to be carried out. Therefore, the latter process is particularly preferred.

Heating in the heat development process can be conducted in various known manners. For example, a heating layer which is arranged on the light-sensitive material can be used as the heating means. The heat development process may be conducted under suppressing the amount of oxygen existing in the light-sensitive layer. The temperature for the heat development process usually ranges from 50° C. to 200° C., preferably from 60° C. to 150° C. The heating time is usually not shorter than 1 second, preferably from 1 second to 5 minutes, more preferably from 1 second to 1 minute.

The light-sensitive material is subjected to the development process to polymerize the polymerizable compound within the area where a latent image of the silver halide has been formed or the area where a latent image of the silver halide has not been formed. Generally, the polymerizable compound is polymerized within the area where a latent image of the silver halide has been formed. However, the polymerizable compound within the area where a latent image of the silver halide has not been formed can also be polymerized in the case that a polymerization inhibitor is formed from a reducing agent within the area where a latent image of the silver halide has been formed. In this case, the polymerization reaction is caused by a thermal polymerization initiator or a photopolymerization initiator, which may be contained in the light sensitive layer (preferably in the microcapsules).

A color image can be obtained on the image-receiving material by pressing the light-sensitive material on the image-receiving material to transfer the unpolymerized polymerizable compound and a color image forming substance to the image-receiving material.

For applying a pressure to the light-sensitive material and the image-receiving material, any known pressing methods can be employed.

For example, the light-sensitive material and the image-receiving material are sandwiched between press plates such as a presser or transferred using a pressure roller such as a nip roll, to apply a pressure to them. A dot-impact device can be also employed to intermittently give a pressure to them. Otherwise, a pressure may be applied to the light-sensitive material and the image-receiving material by spraying a high-pressure air by means of an air gun or using a ultrasonic wave-generating device or a piezoelectric element.

The light-sensitive material can be pressed on the image-receiving material while heating. In this case, the pressure can be reduced. The heating temperature preferably is lower than the temperature of the heat development process. The difference between the temperatures more preferably is more than 10° C.

The light-sensitive material of the invention can be used for color photography, printing and copy (e.g., computer-graphic hard copy).

The present invention is further described by the following examples, but those examples are given by no means to restrict the invention.

EXAMPLE 1

Preparation of silver halide emulsion (EB-1)

In 1,500 ml of water were dissolved 16 g of gelatin and 0.5 g of sodium chloride, and the resulting gelatin solution was adjusted to pH 3.2 using 1N-sulfuric acid and was kept at 50° C. To the gelatin solution, 300 ml of an aqueous solution containing 71 g of potassium bromide and 300 ml of an aqueous solution containing 0.59 mole of silver nitrate were added simultaneously at the same feed rate over 50 minutes. After 1 minute, to the resulting mixture was added 43 ml of 1% methanol solution of the sensitizing dye (SB-1), and after 15 minutes, to the resulting mixture were further added 100 ml of an aqueous solution containing 2.9 g of potassium iodide and 100 ml of an aqueous solution containing 0.018 mole of silver nitrate at the same feed rate over 5 minutes. To the resulting emulsion was then added 10 ml of 10% alkaline solution of polyisobutylene/monosodium maleate copolymer. After the emulsion was washed with water for desalting, 4 g of gelatin was added to the emulsion. Then, to the emulsion was further added 0.5 mg of sodium thiosulfate to chemically sensitize the emulsion at 50° C. for 15 minutes. Thus, 460 g of a silver halide emulsion (EB-1) (tetradecahedral monodispersed silver iodobromide emulsion, mean grain size: 0.22 μm, distribution coefficient: 20%) was prepared.

Sensitizing dye (SB-1)

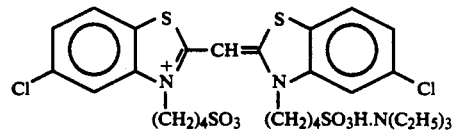

Preparation of silver halide emulsion (EG-1)

In 1,600 ml of water were dissolved 20 g of gelatin and 0.5 g of sodium chloride, and the resulting gelatin solution was adjusted to pH 3.2 using 1N-sulfuric acid and was kept at 42° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 1 minute, to the resulting mixture was added 48 ml of 1% methanol solution of the sensitizing dye (SG-1), and after 10 minutes, to the resulting mixture were further added 100 ml of an aqueous solution containing 2.9 g of potassium iodide and 100 ml of an aqueous solution containing 0.018 mole of silver nitrate at the same feed rate over 5 minutes. To the resulting emulsion was then added 10 ml of 10% alkaline solution of polyisobutylene/monosodium maleate copolymer. After the emulsion was washed with water for desalting, 4.5 g of gelatin was added to the emulsion. Then, to the emulsion was further added 0.7 mg of sodium thiosulfate to chemically sensitize the emulsion at 60° C. for 15 minutes. Thus, 460 g of a silver halide emulsion (EG-1) (tetradecahedral monodispersed silver iodobromide emulsion, mean grain size: 0.12 μm, distribution coefficient: 21%) was prepared.

Sensitizing dye (SB-1)

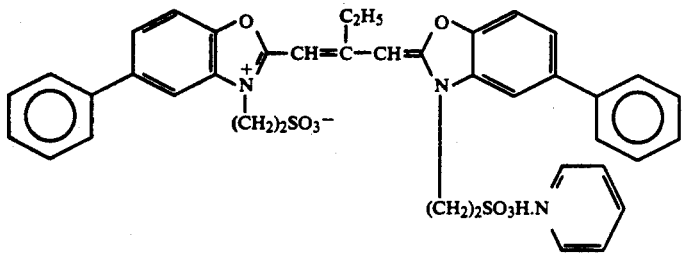

Preparation of silver halide emulsion (ER-1)

In 1,600 ml of water were dissolved 20 g of gelatin and 0.5 g of sodium chloride, and the resulting gelatin solution was adjusted to pH 3.5 using 1N-sulfuric acid and was kept at 45° C. To the gelatin solution, 200 ml of an aqueous solution containing 71 g of potassium bromide and 200 ml of an aqueous solution containing 0.59 mole of silver nitrate were added simultaneously at the same feed rate over 30 minutes. After 5 minutes, to the resulting mixture was added 48 ml of 0.5% methanol solution of the sensitizing dye (SR-1), and after 15 minutes, to the resulting mixture were further added 100 ml of an aqueous solution containing 3.65 g of potassium iodide and 100 ml of an aqueous solution containing 0.022 mole of silver nitrate at the same feed rate over 5 minutes. To the resulting emulsion was then added 10 ml of 10% alkaline of polyisobutylene/monosodium maleate copolymer. After the emulsion was washed with water for desalting, 3.5 g of gelatin was added to the emulsion. Then, to the emulsion was further added 0.45 mg of sodium thiosulfate to chemically sensitize the emulsion at 55 ©C for 20 minutes. Thus, 460 g of a silver halide emulsion (ER-1) (tetradecahedral monodispersed silver iodobromide emulsion, mean grain size: 0.13 μm, distribution coefficient: 24%) was prepared.

Sensitizing dye (SR-1)

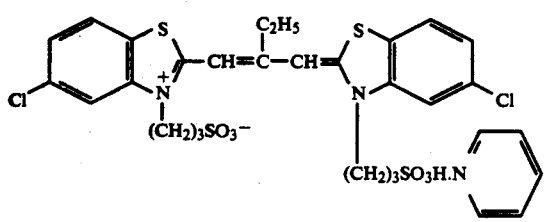

Preparation of pigment dispersion (GY-1)

To 255 g of the polymerizable compound (MN-2) was added 45 g of Microlith Yellow 4GA (tradename of Ciba-Geigy). The resulting mixture was stirred at 5,000 r.p.m. using Eiger Motor Mill (tradename of Eiger Engineering) for 1 hour to obtain a pigment dispersion (GY-1).

Polymerizable compound (MN-2)

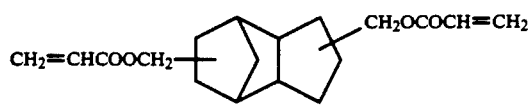

(Kayarad R684, tradename of Nippon Kayaku Co., Ltd.)

Preparation of pigment dispersion (GM-1)

To 255 g of the polymerizable compound (MN-2) was added 45 g of Microlith Red 117A (tradename of Ciba-Geigy). The resulting mixture was stirred at 5,000 r.p.m. using Eiger Motor Mill for 1 hour to obtain a pigment dispersion (GM-1).

Polymerizable compound (MN-1)

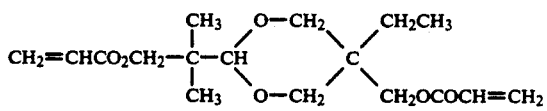

Preparation of pigment dispersion (GC-1)

In 255 g of the polymerizable compound (MN-1) was added 45 g of Microlith Blue (tradename of Ciba-Geigy). 3.0 g of Solsperse 5000 (tradename of ICI). The resulting mixture was stirred at 5,000 r.p.m. using Eiger Motor Mill for 1 hour to obtain a pigment dispersion (GC-1).

Preparation of solid dispersion (KB-1)

In 300 ml dispersion container were placed 110 g of 5.4% aqueous solution of limed gelatin, 20 g of 5% aqueous solution of polyethylene glycol (average molecular weight: 2000), 70 g of the base precursor (BG-1) and 200 ml of glass beads (diameter: 0.5 to 0.75 mm). The resulting mixture was stirred at 3,000 r.p.m. for 30 minutes using a Dynomill, and adjusted to pH 6.5 using 2N sulfuric acid to obtain a solid dispersion (KB-1). The grain size was not more than 1.0 μm.

Base precursor (BG-1)

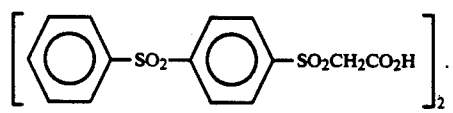

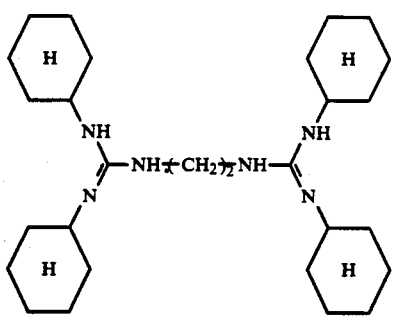

Preparation of light-sensitive composition (PB-1)

To 45 g of the pigment dispersion (GY-1), 9 g of 20 weight % solution of the following copolymer (1P-1) in the following solvent (SV-1). To the resulting solution, 2.42 g of (RD-1), 3.29 g of (RD-2) and 0.006 g of (FF-1) were added to prepare an oily solution.

To the resulting solution, 4.5 g of the silver halide emulsion (EB-1) and 38 g of the solid dispersion (KB-1) were added, and the resulting mixture was stirred at 15,000 r.p.m. for 5 minutes at 50° C. using a homogenizer to obtain a light-sensitive composition (PB-1) in the form of a W/O emulsion.

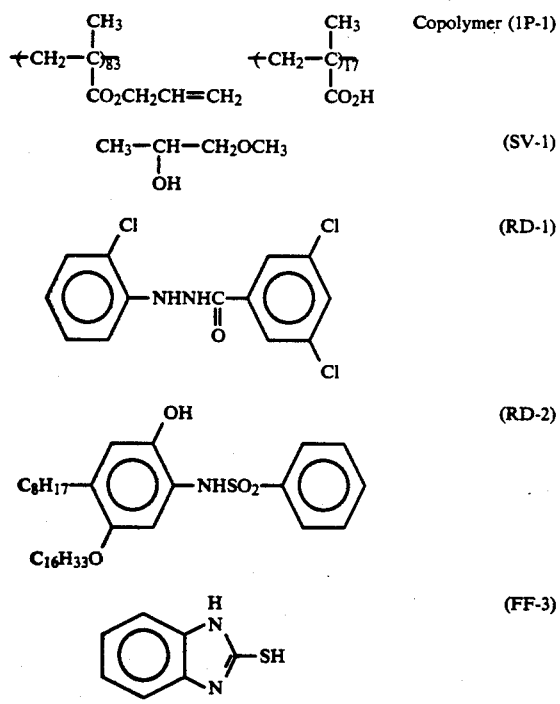

Preparation of light-sensitive composition (PG-1)

A light sensitive composition (PG-1) was prepared in the same manner as in preparation of the composition (PB-1) except that the silver halide emulsion (EG-1) was used in place of the emulsion (EG-1) and the pigment dispersion (GM-1) was used in place of the dispersion (GY-1).

Preparation of light-sensitive composition (PR-1)

A light-sensitive composition (PR-1) was prepared in the same manner as in preparation of the composition (PB-1) except that the silver halide emulsion (ER-1) was used in place of the emulsion (EG-1) and the pigment dispersion (GC-1) was used in place of the dispersion (GY-1).

Preparation of microcapsule dispersion (CB-1)

A mixture of 30 g of 2% aqueous solution of potassium polyvinylbenzenesulfinate and 100 g of 10% aqueous solution of polyvinyl pyrrolidone (K-90, tradename of Wako Junyaku Co., Ltd.) was adjusted to pH 5.0. The light-sensitive composition (PB-1) was added to the mixture and the resulting mixture was stirred at 3,000 r.p.m. for 30 minutes at 50 ° C. using a dissolver to obtain a W/O/W emulsion.

Independently, to 14.8 g of melamine were added 20.0 g of 37% aqueous solution of formaldehyde and 76.3 g of distilled water, and the resulting mixture was stirred at 60° C. for 40 minutes to obtain a transparent melamine formaldehyde precondensate.

To 146 g of the above-prepared W/O/W emulsion were added 40.0 g of the precondensate and 8 of water. The resulting mixture was adjusted to pH 5.0 using 10% sulfuric acid. The mixture was then heated to 60 ° C. and stirred for 30 minutes. Further, to the mixture was added 11 g of 40% aqueous solution of urea, and the mixture was adjusted to pH 6.5 using 10% aqueous solution of sodium hydroxide. Thus, a light-sensitive microcapsule dispersion (CB-1) containing microcapsules having a melamine-formaldehyde resin shell was prepared.

Preparation of microcapsule dispersion (CG-1)

A light-sensitive microcapsule dispersion (CG-1) was prepared in the same manner as in preparation of the dispersion (CB-1) except that the light-sensitive composition (PG-1) was used in place of the composition (PB-1).

Preparation of microcapsule dispersion (CR-1)

A light-sensitive microcapsule dispersion (CR-1) was prepared in the same manner as in preparation of the dispersion (CB-1) except that the light-sensitive composition (PR-1) was used in place of the composition (PB-1).

Preparation of light-sensitive material (101)

To the mixture of 51 g of the light-sensitive microcapsule dispersion (CB-1), 51 g of the light-sensitive microcapsule dispersion (CG 1) and 51 g of the light-sensitive microcapsule dispersion (CR-1) were added 9.7 g of 10aqueous solution of the following surface active agent (a), 12.2 g of 1% aqueous solution of the following surface active agent (b) and 12.4 g of 10% aqueous solution of polyvinyl alcohol (average molecular weight: 2,000). To the mixture was added water up to 221.6 g to prepare a coating solution.

Onto a polyethylene terephthalate film (thickness: 25 μm) aluminum was vacuum evaporated to prepare a support.

The coating solution was coated over the support in coating amount of 135 g/m², and the coated layer of the solution was dried to prepare a light-sensitive material (101).

Surface active agent (a)

-continued

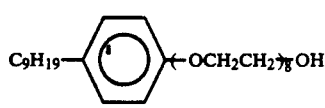

Surface active agent (b)

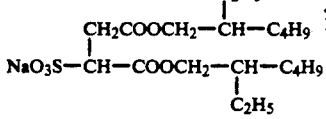

Preparation of light-sensitive materials (102) to (107)

Light-sensitive materials (102) to (107) were prepared in the same manner as in the preparation of the material (1), except that 7 g of $K_2CrO_4$, 7 g of $Na_2MoO_4.2H_2O$, 6 g of $Na_3[PMo_{12}O_{40}]10H_2O$, 7 g of $CaMoO_4$, 11 g of $Na_2WO_4.2H_2O$ and 9 g of $Na_3[PW_{12}O_{40}].15H_2O$ were respectively added to the solid dispersion (KB-1).

Preparation of image-receiving material

A mixture of 80 g of calcium carbonate (Calight SA, tradename of Shiraishi Industrial Co., Ltd.), 1.9 g of a surface active agent (poize 520, tradename of Kao Co., Ltd.) and 118.1 g of water was stirred at 2,000 r.p.m. for 10 minutes using Polytoron dispersing device (PT 10/35, tradename of Kinematica Co., Ltd.). To 52 g of the resulting dispersion were added 4 g of 1% aqueous solution of the surface active agent (b) and 52 g of 10% aqueous solution of polyvinyl alcohol (PVA-117, tradename of Kuraray Co., Ltd.), and then water were added up to 130 g to prepare a coating solution for an image-receiving layer.

The coating solution was coated over a paper having a basis weight of 80 g/m² (i.e., a paper having a fiber length distribution [defined by JIS-P-8207] in which the sum of weight percent of 24 mesh residue and 42 mesh residue is within a range of 30 to 60%, as described in Japanese Patent Provisional Publication No. 63(1988)-186239) in amount of 65 g/m², and the coated layer of the solution was dried at 60° C. to prepare an image-receiving material.

Image formation and evaluation thereof

Each of the light sensitive materials (101) to (107) was imagewise exposed to light at color temperature of 4,800 K and at 2,000 lux for 1 second using a tungsten lamp over a step wedge, and then heated on a hot plate from the side of the support at 145° C. for 2 seconds. Thereafter, the light-sensitive material was superposed on the image-receiving material in such a manner that the light-sensitive layer faced the image-receiving layer, and they were passed through pressure rolls (diameter: 50 mm) at pressure of 1,000 kg/cm². Then the light-sensitive material was separated from the image-receiving material. The maximum density and the minimum density of the gray image formed on the image-receiving material were measured.

Further, an image was formed and evaluated using the light-sensitive material (101) in the same manner as mentioned above, except that the heating temperature was changed from 145° C. to 155° C.

The results are set forth in Table 1.

TABLE 1

| Light-sensitive Material | Cr, Mo or W (VI) Compound | Minimum Density/Maximum Density | | |
|---|---|---|---|---|
| | | Yellow | Magenta | Cyan |
| (101) | — | 0.44/1.2 | 0.46/1.3 | 0.48/1.3 |
| | | (0.22/1.1 | 0.23/1.3 | 0.26/1.2)* |
| (102) | $K_2CrO_4$ | 0.22/1.2 | 0.24/1.3 | 0.25/1.2 |
| (103) | $Na_2MoO_4.2H_2O$ | 0.21/1.2 | 0.22/1.3 | 0.23/1.3 |
| (104) | $Na_3[PMo_{12}O_{40}].10H_2O$ | 0.21/1.2 | 0.22/1.3 | 0.22/1.3 |
| (105) | $CaMoO_4$ | 0.28/1.1 | 0.28/1.2 | 0.29/1.2 |
| (106) | $Na_2WO_4.2H_2O$ | 0.24/1.2 | 0.25/1.2 | 0.26/1.3 |
| (107) | $Na_3[PW_{12}O_{40}].15H_2O$ | 0.27/1.1 | 0.29/1.2 | 0.29/1.1 |

Remark (*): The light-sensitive material (101) was heated at 155° C. for 2 seconds.

It is apparent from the results in Table 1 that the light-sensitive materials (102) to (107) of the present invention form a clear image, even if the heating temperature is relatively low (145° C.).

EXAMPLE 2

Light-sensitive materials (201) to (207) were prepared in the same manner as in Example 1 except that the same amount of (RD-3) was used in place of (RD-2).

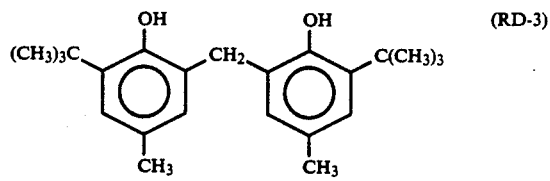

Each of the light-sensitive materials was evaluated in the same manner as in Example 1. As a result, the light-sensitive materials (202) to (207) of the present invention form a clear image, even if the heating temperature is relatively low.

EXAMPLE 3

Preparation of light-sensitive composition (PR-2)

To 40 g of the polymerizable compound (MN-1) were added 2 g of the following oil-soluble dye, 9 g of 20 weight % solution of the copolymer (1P-1) in the solvent (SV-1), 2.3 g of (RD-1), 3.2 g of (RD-2), 0.006 g of (FF-1) and 5 g of stearyl alcohol were added and heated at 50° C. to prepare an oily solution.

To the resulting solution, 3.8 g of the silver halide emulsion (ER-1) and 24 g of the solid dispersion (KB-1) were added, and the resulting mixture was stirred at 15,000 r.p.m. for 5 minutes at 50° C. using a homogenizer to obtain a light-sensitive composition (PB-2) in the form of a W/O emulsion.

Oil-soluble dye

-continued

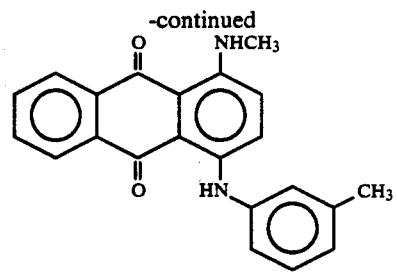

Preparation of microcapsule dispersion (CR-2)

A microcapsule dispersion (CR-2) was prepared in the same manner as in preparation of the dispersion (CR-1) Example 1, except that the light-sensitive composition (PR-2) was used in place of (PR-1).

Preparation of light-sensitive material (301)

To 45 g of the light-sensitive microcapsule dispersion (CR-2) were added 5.6 g of 10% aqueous solution of the surface active agent (a), 7.0 g of 1% aqueous solution of the surface active agent (b), 7.2 g of 20% aqueous solution of polyvinyl alcohol (average molecular weight: 2,000) and 3 g of water to prepare a coating solution.

Onto a polyethylene terephthalate film (thickness: 25 μm) aluminum was vacuum evaporated to prepare a support.

The coating solution was coated over the support in coating amount of 67.5 g/m², and the coated layer of the solution was dried to prepare a light-sensitive material (301).

Preparation of light-sensitive materials (302) to (305)

Light-sensitive materials (302) to (305) were prepared in the same manner as in the preparation of the material (301), except that 3 g of the following solutions were respectively used in place of 3 g of water.

302: 7 weight % aqueous solution of $K_2CrO_4$ neutralized with $2N$-$H_2SO_4$

303: 7 weight % aqueous solution of $Na_3[PMo_{12}O_{40}].10H_2O$ neutralized with $2N$-$H_2SO_4$ 304: 10 weight % aqueous solution of $K_2MoO_4$ neutrized with $2N$-$H_2SO_4$ 305: 12 weight % aqueous solution of $K_2WO_4$ neutrized with $2N$-$H_2SO_4$ Image formation and evaluation thereof Each of the light-sensitive materials (301) to (305) was evaluated in the same manner as in Example 1.
The results are set forth in Table 2.

TABLE 2

| Light-sensitive Material | Cr, Mo or W (VI) Compound | Maximum Density | Minimum Density |
|---|---|---|---|
| (301) | — | 1.3 | 0.42 |
|  |  | (1.3)* | (0.21)* |
| (302) | $K_2CrO_4$ | 1.3 | 0.23 |
| (303) | $Na_3[PMo_{12}O_{40}].10H_2O$ | 1.3 | 0.20 |

TABLE 2-continued

| Light-sensitive Material | Cr, Mo or W (VI) Compound | Maximum Density | Minimum Density |
|---|---|---|---|
| (304) | $K_2MoO_4$ | 1.2 | 0.20 |
| (305) | $K_2WO_4$ | 1.3 | 0.25 |

Remark (*): The light-sensitive material (301) was heated at 155° C. for 2 seconds.

It is apparent from the results in Table 1 that the light-sensitive materials of the present invention form a clear image at a relatively low temperature, even if the chromium, molybdenum or tungsten compound is arranged outside of the microcapsules.

EXAMPLE 4

Preparation of light-sensitive materials (401) and (402)

A light-sensitive material (401) was prepared in the same manner as in preparation of the material (301) in Example 3, except that the light-sensitive microcapsule dispersion (CR-1) was used in place of (CR-2).

A light-sensitive material (402) was prepared in the same manner as in preparation of the material (401) except that 3 g of 7 weight % aqueous solution of $Na_3[PMo_{12}O_{40}].10H_2O$ (neutrized with $2N$-$H_2SO_4$) was used in place of 3 g of water.

Image formation and evaluation thereof

Each of the light-sensitive materials (401) and (402) was imagewise exposed to light in the same manner as in Example 1, and then heated on a hot plate from the side of the support at 155° C. for 1 second. Thereafter, the light-sensitive material was superposed on the image-receiving material in such a manner that the light-sensitive layer faced the image-receiving layer, and they were passed through pressure rolls (diameter: 50 mm) at pressure of 250 kg/cm². Then the light-sensitive material was separated from the image-receiving material. The maximum density and the minimum density of the cyan positive image formed on the image-receiving material were measured.

Further, an image was formed and evaluated using the light-sensitive material (101) in the same manner as mentioned above, except that the heating time was changed from 1 second to 2 seconds.

The results are set forth in Table 3.

TABLE 3

| Light-sensitive Material | Cr, Mo or W (VI) Compound | Heating Time | Maximum Density | Minimum Density |
|---|---|---|---|---|
| (401) | — | 1 second | 1.2 | 0.45 |
| (401) | — | 2 seconds | 1.3 | 0.22 |
| (402) | $Na_3[PMo_{12}O_{40}].10H_2O$ | 1 second | 1.3 | 0.21 |

It is apparent from the results in Table 3 that the light-sensitive material of the present invention quickly form a clear image.

I claim:

1. A light-sensitive material comprising a support and a light-sensitive layer provided thereon, which contains silver halide, a reducing agent and an ethylenically unsaturated polymerizable compound,
   wherein the light-sensitive layer further contains a chromium (VI) compound, a molybdenum (VI) compound or a tungsten (VI) compound.

2. The light-sensitive material as claimed in claim 1, wherein the silver halide, a reducing agent and an ethylenically unsaturated polymerizable compound are contained in microcapsules which are dispersed in the light-sensitive layer, and the chromium, molybdenum or tungsten compound is contained in the microcapsules.

3. The light-sensitive material as claimed in claim 1, wherein the silver halide, a reducing agent and an ethylenically unsaturated polymerizable compound are contained in microcapsules which are dispersed in the light-sensitive layer, and the chromium, molybdenum or tungsten compound is arranged outside of the microcapsules.

4. The light-sensitive material as claimed in claim 1, wherein the chromium, molybdenum or tungsten compound is in the form of a salt of an oxide (VI).

5. The light-sensitive material as claimed in claim 1, wherein the chromium, molybdenum or tungsten compound is in the form of a salt of an oxide (VI) with an alkali metal, an alkaline earth metal or ammonia.

6. The light-sensitive material as claimed in claim 1, wherein the chromium, molybdenum or tungsten compound is a molybdenum (VI) compound.

7. The light-sensitive material as claimed in claim 1, wherein the chromium, molybdenum or tungsten compound is water-soluble.

8. The light-sensitive material as claimed in claim 1, wherein the chromium, molybdenum or tungsten compound is a chromium (VI) compound selected from $(NH_4)_2CrO_4$, $K_2CrO_4$, $Na_2CrO_4.4H_2O$, $Cs_2CrO_4$, $BaCrO_4$, $MgCrO_4.5H_2O$, $K_2Mg(CrO_4)_2.2H_2O$ and $(NH_4)_2Mg(CrO_4)_2.6H_2O$.

9. The light-sensitive material as claimed in claim 1, wherein the chromium, molybdenum or tungsten compound is a molybdenum (VI) compound selected from $MoO_3.H_2O$, $(NH_4)_6Mo_7O_{24}.4H_2O$, $K_2MoO_4$, $Na_2MoO_4.2H_2O$, $CaMoO_4$, $(NH_4)_3[PMo_{12}O_{40}].3H_2O$, $Na_3[PMo_{12}O_{40}].10H_2O$ and $Li_2MoO_4$.

10. The light-sensitive material as claimed in claim 1, wherein the chromium, molybdenum or tungsten compound is a tungsten (VI) compound selected from $WO_3.H_2O$, $K_2WO_4$, $Na_2WO_4.2H_2O$, $CaWO_4$, $MgWO_4$, $Na_3[PW_{12}O_{40}].15H_2O$ and $(NH_4)_{10}W_{12}O_{41}.5H_2O$.

11. The light-sensitive material as claimed in claim 1, wherein the amount of the chromium, molybdenum and tungsten atoms contained in the light-sensitive layer is in the range of 0.1 mg/m$^2$ to 2,000 mg/m$^2$.

12. The light-sensitive material as claimed in claim 1, wherein the light-sensitive layer further contains a color image forming substance.

13. The light-sensitive material as claimed in claim 1, wherein the light-sensitive layer further contains a base precursor.

14. The light-sensitive material as claimed in claim 1, wherein the light-sensitive material is heat-developable.

15. The light-sensitive material as claimed in claim 1, wherein the chromium, molybdenum or tungsten compound is a chromium (VI) oxide compound, a molybdenum (VI) oxide compound or a tungsten (VI) oxide compound.

* * * * *